United States Patent
Tanaka

[19]

[11] Patent Number: 6,072,915

[45] Date of Patent: *Jun. 6, 2000

[54] PROCESS FOR PATTERN SEARCHING AND A DEVICE FOR POSITIONING OF A MASK TO A WORKPIECE

[75] Inventor: Yoneta Tanaka, Yokohama, Japan

[73] Assignee: Ushiodenki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/782,330

[22] Filed: Jan. 13, 1997

[30] Foreign Application Priority Data

Jan. 11, 1996 [JP] Japan ................................. 8-002953

[51] Int. Cl.⁷ ..................................................... G06K 9/36
[52] U.S. Cl. .......................... 382/287; 382/108; 382/145; 382/149; 382/151; 382/152; 382/181; 382/199; 382/287
[58] Field of Search ................................. 382/108, 286, 382/287, 181, 144, 145, 149, 151, 152, 199

[56] References Cited

U.S. PATENT DOCUMENTS

| | | | |
|---|---|---|---|
| 3,898,617 | 8/1975 | Kashioka et al. | 340/146.3 |
| 4,115,762 | 9/1978 | Akiyama et al. | 340/146.3 |
| 4,566,125 | 1/1986 | Clunn | 382/48 |
| 4,688,088 | 8/1987 | Hamazaki et al. | 358/101 |
| 4,794,646 | 12/1988 | Takeuchi et al. | 382/8 |
| 4,794,648 | 12/1988 | Ayata et al. | 382/8 |
| 4,878,114 | 10/1989 | Huynh et al. | 358/101 |
| 5,543,921 | 8/1996 | Uzawa et al. | 356/399 |
| 5,627,912 | 5/1997 | Matsumoto | 348/87 |

*Primary Examiner*—Christopher S. Kelley
*Assistant Examiner*—Sheela Chawan
*Attorney, Agent, or Firm*—Sixbey, Friedman, Leedom & Ferguson; David S. Safran

[57] ABSTRACT

A process for pattern searching in which position coordinates of patterns on a workpiece with a rough surface can be determined automatically and with high precision, and a device for executing the process are achieved by CCD cameras and the like picking up patterns which are located on a workpiece with a rough surface, and which are formed only by intersecting lines, and by a storage means storing light-dark signals. Furthermore, according to the invention, the image signals are integrated in directions which are each parallel to the lines of the patterns, by which integral signals $\Sigma Xn, \Sigma Yn$ are determined. By integrating the image signals, the images which are formed as a result of surface roughness are averaged. The integration signals clearly yield boundary positions of the patterns, and by differentiating these integral signals, the pattern positions are determined based on their peak positions.

4 Claims, 6 Drawing Sheets

Alignment mark

Recorded pattern

Searched pattern A

Searched pattern B

Searched pattern C

Alignment mark AM

PROCESS FOR PATTERN SEARCHING AND A DEVICE FOR POSITIONING OF A MASK TO A WORKPIECE

BACKGROUND OF THE INVENTION

1. Field of the Invention

The invention relates to a process for searching patterns for the purpose of positioning or the like in an exposure for the production of semiconductor components, printed boards, liquid crystal displays, printer heads of the inkjet type, multichip modules and the like process, and also for determining the marks in a chip mounter, a bonder, a probing tester and the like and for similar purposes. The invention furthermore relates to a device for positioning of a mask to a workpiece. The invention relates especially to a process for searching patterns, a process which is suitable for determining marks on a workpiece with a rough surface, and a device for positioning of a mask to a workpiece. In particular, to such a device which can be used, not only for searching patterns on a semiconductor substrate, but also for searching patterns on a ceramic substrate, a metal and a thin metallic plate, a printed board, a glass substrate which is not polished to a high gloss, and the like.

2. Description of Related Art

Production of semiconductor components, printed boards, liquid crystal displays, printer heads of the inkjet type, multichip modules and the like includes an exposure process. In this exposure process, it is important in the transfer of the mask pattern onto the workpiece that another pattern to be subsequently transferred is exactly positioned relationship to a pattern which has been formed beforehand. The above-described positioning is conventionally done such that the alignment marks which are recorded on the mask and the workpiece come to rest on top of one another.

FIG. 7 schematically shows the arrangement of a device for determining the alignment marks on a workpiece. In the drawings reference letters AU indicate an alignment unit which consists of a half mirror M, lenses L1, L2 and CCD camera 11. Furthermore, reference number 12 identifies a monitor and numeral 13 an arithmetic-logic unit. The workpiece on which alignment marks AM are projected or recorded is designated W.

In the following, a pattern search of alignment marks AM on workpiece W is described using FIG. 7.

First, alignment marks AM are recorded in arithmetic-logic unit 13. For example, cross-shaped marks as in FIG. 8(a) are used as alignment marks AM. In arithmetic-logic unit 13, patterns of alignment marks AM are recorded, in which monitor pixels are regarded as unity, as is illustrated in FIG. 8(b). In the figure, the number of pixels is set to a 5×5 matrix to facilitate the explanation.

Next, as is shown in FIG. 7, illumination light is transmitted via the half mirror M of alignment units AU onto alignment marks AM on workpiece W. Alignment marks AM are picked up by CCD cameras 11, one of which is depicted in FIG. 7. Furthermore, images of alignment marks AM which have been projected onto monitor 12 are input into arithmetic-logic unit 13 and converted into coordinate data, the pixels of the monitor being considered unity. In arithmetic-logic unit 13, the above described recorded patterns are compared to the images of the picked-up alignment marks.

The case in which the images of the picked-up alignment marks (searched patterns) correspond to searched pattern A in FIG. 8(c) is recognized as score 60 because agreement with the recorded pattern is around 60%.

The case in which the images of the picked-up alignment marks (searched patterns) correspond to searched pattern B in FIG. 8(d) is recognized as score 80 because agreement with the recorded pattern is around 80%.

The case in which the images of the picked-up alignment marks (searched patterns) correspond to searched pattern C in FIG. 8(e) is recognized as score 100 because agreement with the recorded pattern is around 100%.

When patterns with a score of roughly 100 are recognized, these patterns are recognized as searched patterns, as was described above.

In the production of semiconductor components and the like, for purposes of cost reduction and the like there are cases in which an etched wafer which has not undergone high gloss polishing is used, when a pattern is formed on the wafer with a line width which is not extremely fine (surface roughness is different depending on the users).

FIG. 9 schematically shows one example of an image of the above described wafer which has not undergone high gloss polishing. As is shown in the drawing, in the case of a wafer which has not undergone high gloss polishing, images with prominent contrasts occur as a result of surface roughness such that they and the image of the alignment mark come to rest on top of one another, or that they are located on the periphery hereof.

If, when the alignment marks which are located on a wafer of this type are recognized, the above described pattern search method is undertaken, the above described images as a result of surface roughness are sent as signals with prominent contrasts from the CCDs camera and the image signals of the searched patterns of the images due to surface roughness are added to the coordinate data of the searched patterns. As a result, the score decreases, and a pattern search can no longer be done.

This also applies in workpieces besides the above described wafer which has not been subjected to high gloss polishing. In the above mentioned ceramic substrate, metal and the metallic thin plate and the like, there are a host of cases in which a search of the alignment marks by the above described pattern search process is difficult to perform.

SUMMARY OF THE INVENTION

The invention was made to eliminate the above described disadvantages of the prior art. Thus, a primary object of the invention is to devise a process by which patterns on a workpiece with a rough surface can be searched automatically and with high precision, and a device for executing the process.

The above described object is achieved in accordance with embodiments of the invention as follows:

(1) To determine the position coordinates of patterns on a workpiece with a rough surface, images of the patterns which are formed only by intersecting parts of lines are stored as light-dark signals. The above described light-dark signals are integrated into directions which are each parallel to the lines of the above described patterns, by which integral signals $\Sigma X_n$, $\Sigma Y_n$ are determined, which each correspond to the above described lines, as is illustrated in FIG. 2. In this way, the images which have been formed as a result of surface roughness are averaged. The above described integral signals become signals which clearly indicate the edge transitions of the patterns, as is illustrated in FIGS. 2(a) and 2(d).

Next, the above described integral values are each differentiated, by which differential signals are obtained which are shown in FIG. 2(b) and 2(e). The pattern positions are determined using the positions of their peak values.

(2) The process described above in (1) for pattern searching is used for a device for positioning of a mask to a workpiece. In doing so, the position coordinates of alignment marks of a workpiece with a rough surface or of alignment marks of a mask which are imaged on a workpiece with a rough surface are determined, and thus, positioning of a mask relative to a workpiece is performed.

In the invention, automatic determination of the pattern positions on the workpiece with a rough surface is enabled with high precision by the measure by which the patterns are searched in the manner described in (1) above.

In the following, the invention is further described in specific terms using the embodiment shown in the drawing. In the embodiment described below a case is described in which the invention is used for positioning of a mask relative to a workpiece in a projection exposure device. But, the invention is not limited to the embodiment described below. The invention can also be used for contact exposure, proximity printing, or pattern searching in a chip mounter, bonder, probing tester and the like, as is described above.

DETAILED DESCRIPTION OF THE PREFERRED EMBODIMENT

Figure 1:
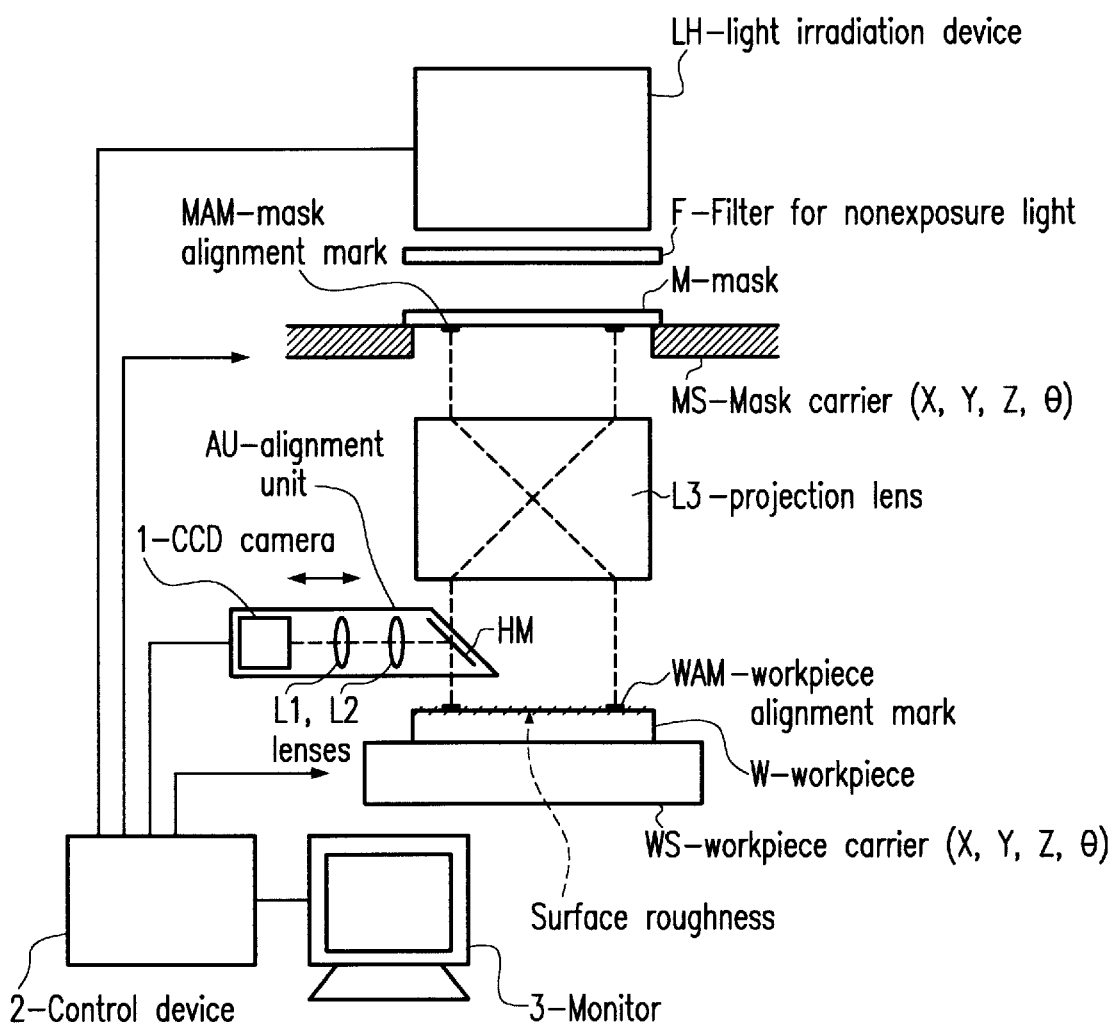
FIG. 1 shows a schematic depiction of an embodiment of a device according to the invention for positioning of a mask relative to a workpiece.

FIG. 1 is a schematic illustration of an embodiment of a projection exposure device according to the invention having a light irradiation device LH for emitting exposure/nonexposure light, which is passed through a filter F for passage of nonexposure light, and a mask M, which is provided with a mask pattern (not shown) and mask alignment marks MAM for purposes of positioning (in the following called only mask marks MAM). Furthermore, a mask carrier MS is provided which can be moved in the X-Y directions (two axes which orthogonally intersect one another on a plane parallel to the mask surface), in the Z-direction (one axis which orthogonally intersects the X-Y plane), and in the θ direction (one revolution around the Z-axis), and on which above mask M is placed and attached by means of a vacuum chuck or the like, as is shown in the drawing.

Furthermore, a projection lens L3 and a workpiece W with a surface which is rough are shown. On the workpiece W, workpiece alignment marks WAM (hereinafter called only workpiece marks WAM) are recorded. Furthermore, reference letters WS labels a workpiece carrier on which above described workpiece W is placed and attached by means of a vacuum chuck or the like.

An alignment unit AU comprises a half-mirror HM, lenses L1, L2, and CCD camera 1, as was described above. Here, in the case of a projection exposure device, the optical path deviates from the projection images of mask marks MAM in above described half mirrors HM, when half mirrors HM have a certain thickness. In this way, the imaging positions of mask marks MAM on workpiece W change and a correction must be obtained according to this change. Half mirrors M are formed conventionally of a resin film, for example, a pellicle with a thickness of a few microns or the like. In this way, the above described effect of thickness is reduced to an amount at which negligible problems occur with respect to use.

Although not shown in the drawing, usually there are several alignment marks (at least at two locations) on mask M and workpiece W, and an alignment unit AU is assigned in correspondence with the number of alignment marks.

Furthermore, reference number 2 identifies a control device and reference number 3 indicates a monitor. Image signals which have been picked up by the CCD cameras 1 of above described alignment units AU are sent to the control device 2 which, by the above described method, determines mask marks MAM imaged on workpiece W and workpiece marks WAM on workpiece W, moves mask carrier MS or workpiece carrier WS and executes automatic positioning of mask M to workpiece W.

In the following, automatic positioning of mask M relative to workpiece W is described using FIG. 1. The technology of automatic positioning of mask M to workpiece W in the above described projection exposure device is known. For this reason, different processes have been conventionally suggested. In this embodiment, it is described by way of a representative example selected therefrom:

(1) Nonexposure light is emitted onto mask M from light irradiation device LH via filter F. Mask marks MAM are projected via the projection lens L3 onto the workpiece W.

(2) By means of CCD cameras 1 of alignment units AU, images of the mask marks MAM imaged onto the workpiece W are picked up. Their image signals (light-dark signals) are sent to control device 2 which determines the position coordinates of the mask marks MAM using the method described below and stores its values. In above described steps (1) and (2) mask marks MAM can also be imaged on a projection surface without placing of a workpiece, and the images of the mask marks MAM which were imaged on the projection surface can be picked up. In this case, exposure light can be emitted from the light irradiation device LH, by which imaging errors or aberrations of the projection lens which are caused by the nonexposure light and exposure light need no longer be considered.

(3) Next, irradiation with nonexposure light is stopped. From an irradiation device of illumination light (not shown), illumination light or the like is emitted onto workpiece marks WAM on workpiece W (nonexposure light which is emitted from the light irradiation device can also be used). The CCD cameras 1 of alignment units AU pick up the images of workpiece marks WAM on workpiece W and their image signals (light-dark signals) are sent to control device 2 which determines the position coordinates of workpiece marks MAM by the method described below, and their values are stored.

(4) If the position coordinates of mask marks MAM and workpiece marks WAM have been determined, control device 2 moves mask carrier MS or the workpiece carrier WS such that the position coordinates of mask marks MAM and the position coordinates of workpiece marks WAM come to rest on top of one another, and thus automatic positioning of mask M relative to workpiece W is achieved. After completing positioning of mask M relative to the workpiece W in the above described manner, alignment units AU are removed to the extent necessary. Then, exposure light is emitted from light irradiation device LH, the mask pattern on mask M is projected onto the workpiece W, and the workpiece is exposed.

If in the determination of the position coordinates of the mask marks MAM and workpiece marks WAM in above described steps (2) and (3), the surface of workpiece W is rough, images with prominent contrasts occur due to surface roughness, as was described above. Therefore, using conventional methods, the position coordinates of mask marks MAM imaged onto the workpiece W or the position coordinates of the alignment marks WAM recorded on the workpiece W cannot be determined.

Furthermore, in the case of determining the position coordinates of mask marks MAM without projecting them onto workpiece the W, it is possible to determine mask marks MAM by the above described conventional process because no influence is exerted by the surface roughness of the workpiece, as was described above. However, due to the surface roughness of the workpiece, it becomes difficult to determine the position coordinates of workpiece marks WAM, because workpiece marks WAM are recorded on workpiece W. Also, in the case in which mask marks MAM are projected onto workpiece W, determination of workpiece marks WAM is especially difficult due to their low contrast, although the images of mask marks MAM have relatively prominent contrasts and can be easily determined.

Figures 3A, 3B:
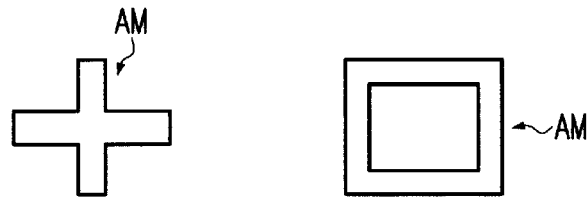
FIGS. 3(a) & 3(b) are examples of the alignment marks used according to the invention.

In this embodiment, alignment marks as in FIG. 3 are used which are formed by lines in a cross-shape, at right angles or in similar ways. In the following, the pattern searching for workpiece marks WAM (the mask marks MAM as necessary) is described. Furthermore, in the following, the workpiece marks WAM and mask marks MAM are called patterns.

Figure 2:
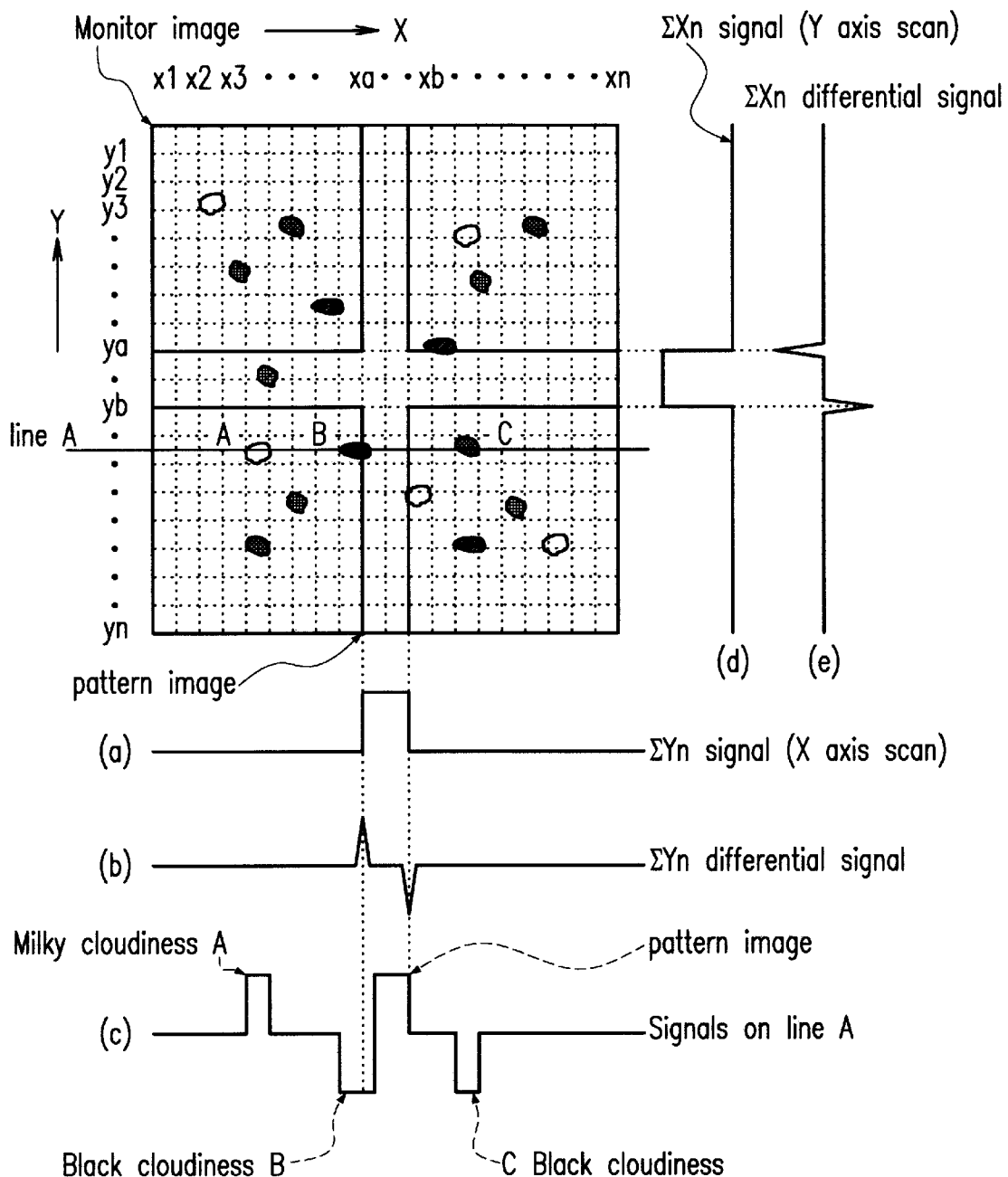
FIG. 2 shows a schematic of the process according to the invention for searching patterns.
Figure 9:
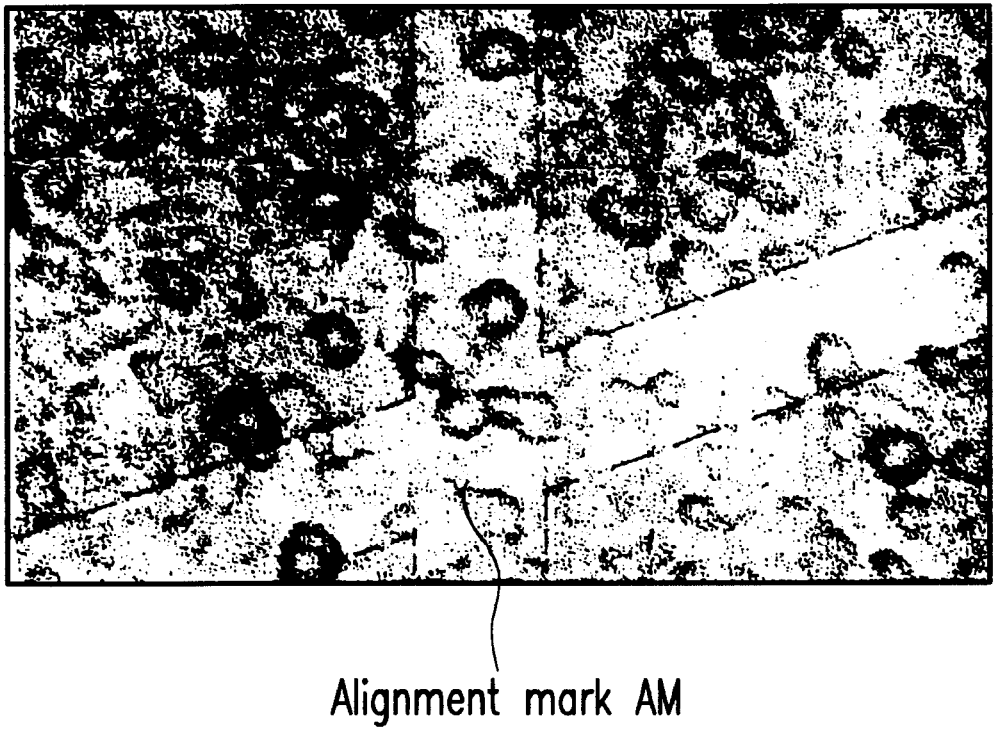
FIG. 9 is a photograph of an example of the image of a wafer which has not undergone high gloss polishing.

FIG. 2 is a schematic of the process for searching the patterns by means of the above described control device 2. The drawing shows a cruciform shaped pattern image which is picked up by CCD camera 1 in FIG. 1 and is displayed on monitor 3. On monitor 3, an images occur, as is shown in the drawing, as a result of the surface roughness of the workpiece, such that they and the pattern image come to rest on top of one another, or such that are located on its periphery as black and milky clouded images (see, FIG. 9). In the FIG. 2 drawing, to facilitate explanation, the cloudy image is shown schematically on monitor 3 as black and hollow circles. In practice, many more black and milky clouded images occur on monitor 3, as was described above. Furthermore, in this embodiment, it is assumed that the pattern image is brighter than the image on its periphery.

When the image shown in FIG. 2 is picked up, the control device 2 integrates the data of the respective pixel along the lines which are parallel to the lines which form the above described pattern. For example, in the case in which the pattern is formed by orthogonally intersecting lines, as is shown in the drawing, for points x1, x2, x3, ..., xn of the x-axis, which is parallel to the above described line 5, the data of the respective pixel are integrated in the Y-axis direction, by which (x1, Σym), (x2, Σym, ... (xn, Σym) [m=1 ... n] is determined. Furthermore, at each of points y1, y2, y3 ..., yn of the Y-axis, which is parallel to the above described line, the data of the respective pixel are integrated in the X-axis direction, by which (y2, Σxm), ... (yn, Σxm) [m=1 ... n] is determined.

Signals $\Sigma X_n$, $\Sigma Y_n$ in FIG. 2(a) and (d) show the above described integral values. The black clouded image parts and the milky clouded image parts on the workpiece are averaged by integration. As is illustrated in FIG. 2(c), for example, milky cloudiness A, black cloudiness B, C and the pattern image occur as image signals. By integrating them, milky cloudiness A and black cloudiness, C are averaged, which diminishes the effect on the integral values.

Furthermore, also in the case in which black cloudiness B and the pattern image come to rest on top of one another, as is shown in the drawing, the effect thereof on the integral value in the Y-axis direction at point xa hardly occurs, by which the position of the pattern image can be reliably determined.

Therefore, by differentiating the signals $\Sigma X_n$, $\Sigma Y_n$ in (a) and (d), signals are obtained which have steep peak values at the edge transition of the pattern, as is illustrated in FIGS. 2(b) and 2(e). In this way, determination of the edge positions of the pattern is enabled with high precision.

Figure 4:
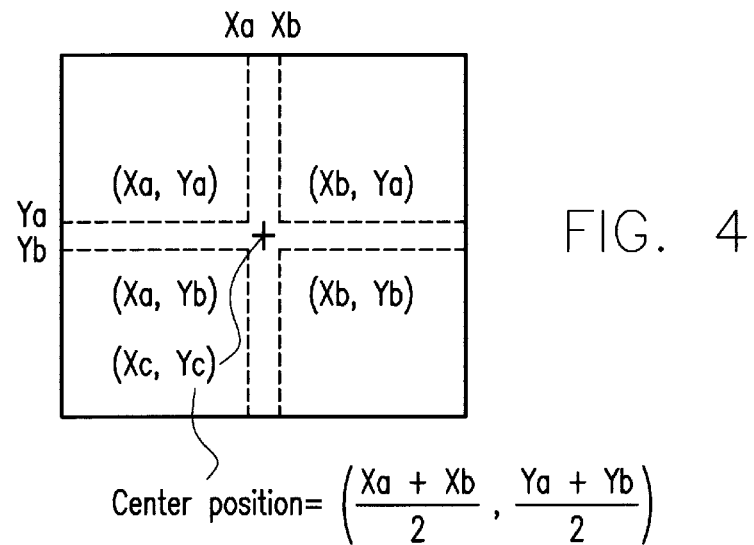
FIG. 4 shows a schematic of a process for determining the positions of the alignment marks.

As was described above, control device 2 first receives integral signal $\Sigma X_n$, differentiates this signal, determines and stores peak position (xa, xb) of the differential signal. Next, it obtains the integral signal $\Sigma Y_n$, differentiates this signal, determines and stores peak position (ya, yb) of the differential signal. Then, middle position (Xc, Yc) is determined by Xc=(xa+xb)/2, Yc - (ya+yb)/2 and the middle position (Xc, Yc) is fixed as the position of the pattern, as is illustrated in FIG. 4.

Figure 5:
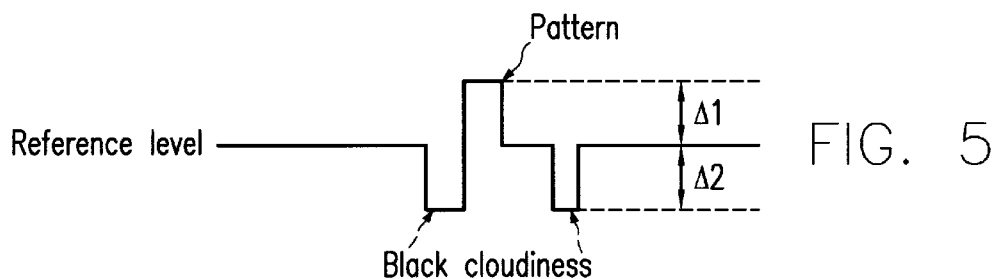
FIG. 5 shows a schematic of a process for determining an average length.

For the above described lengths of segments x1-xn, y1-yn to be integrated (these lengths are called average lengths), roughly, lengths are necessary with which the black cloudiness and the milky cloudiness which can be observed as a result of surface roughness of the workpiece can be cancelled by averaging. These lengths can be determined as follows:

If, for example, in FIG. 2, image signals along the line in the X-axis direction or Y-axis direction are observed and the data in FIG. 5 obtained, Δ1 means a contrast difference of the pattern with respect to the reference level and Δ2 is a contrast difference of the black cloudiness and the milky cloudiness which can be observed as a result of the surface roughness of the workpiece with respect to the reference level.

Furthermore, the average lengths L are fixed by values d and k, where d is the grain size d of the black and milky cloudiness which can be observed as a result of the surface roughness of the workpiece and k is a coefficient corresponding to the surface roughness (the greater the surface roughness, the larger that the coefficient k becomes). The larger Δ1, the smaller average lengths L which can be achieved. The larger Δ2 and grain size d, the larger average lengths L must be made. This means that average lengths L are selected such that, with respect to value α of the following formula, L>α is obtained:

$$\alpha = |\Delta 2/\Delta 1| \cdot d \cdot k$$

The amount of surface roughness of the workpiece differs depending on the types of workpieces, users and the like.

The values of the grain size of the black and milky cloudiness d, the values of Δ1, Δ2 and k are also different accordingly. Thus, it is desirable that the average lengths L be selected according to the amount of surface roughness of the workpiece.

If, therefore, it is provided, for example, that the magnification factor of the alignment units AU can be changed, and if the magnification factor is set according to the amount of surface roughness of the workpiece, determination of the pattern positions with high precision for different workpieces is enabled.

In this case, the size of workpiece mark WAM is fixed to be slightly larger than grain size d of the black and milky cloudiness which corresponds to the amount of surface roughness of workpiece W.

In the above described embodiment, it is described that the pattern, with regard to the reference level, is in the positive range (+) (the pattern is lighter). However, the pattern can also be in the negative range (−) with regard to the reference level (the pattern is darker).

Figures 6A, 6B:
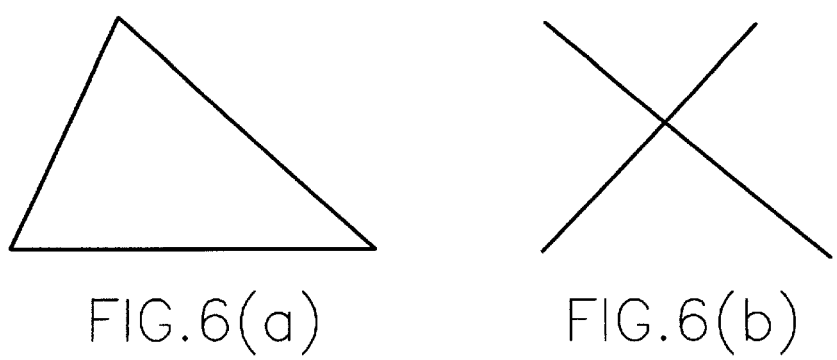
FIGS. 6(a) & 6(b) show examples of alignment marks which are consists of segments which do not orthogonally intersect.
Figure 7:
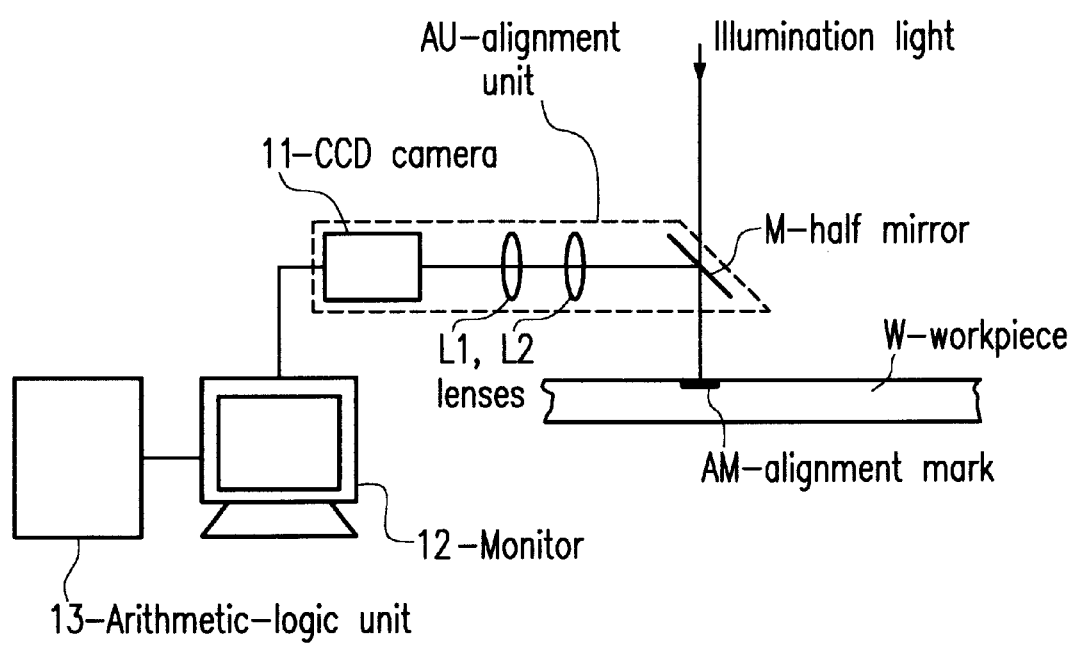
FIG. 7 shows a schematic of the arrangement of a prior art device for determining the position of alignment marks.
Figure 8A:
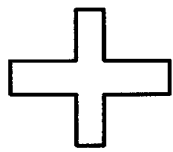
FIG. 8 shows a schematic of a conventional pattern search process.
Figure 8B:
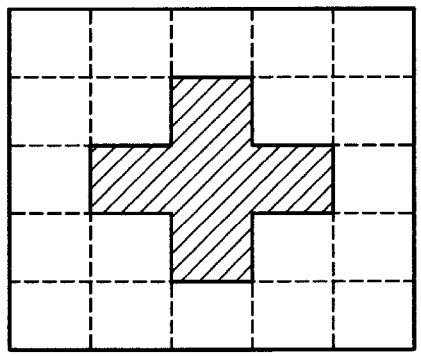
Figure 8C:
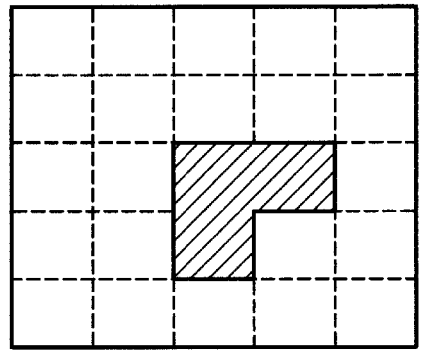
Figure 8D:
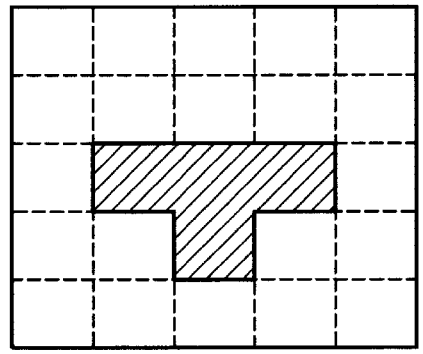
Figure 8E:
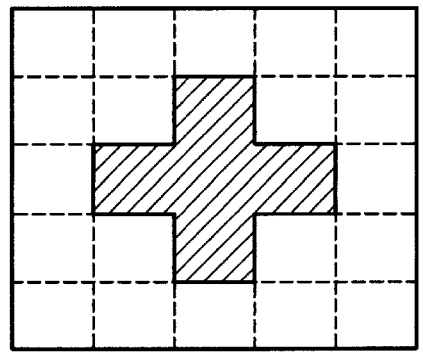

In the above described embodiment, an example was shown in which a pattern is used which is formed by orthogonally intersecting lines. The lines which form the pattern, however, need not orthogonally intersect one another. As is illustrated in FIG. 6, in the case of using a pattern which is formed by straight lines which do not orthogonally intersect, it is necessary that the above described integral directions are parallel to the lines which form the pattern.

As was described above, the invention is not limited to the projection exposure device. Alignment units AU are inserted, for example, in the case of a contact exposure device and a proximity printing device without using projection lens L3 between the light irradiation device LH and mask M, and the workpiece marks WAM are determined through mask MAM. In doing so, mask marks MAM are not projected onto workpiece W and are determined directly. Therefore, they can be determined using the conventional process when the effect of the surface roughness of workpiece W is not a factor. Determination of the position coordinates of workpiece marks WAM becomes difficult, however, as a result of the surface roughness of workpiece W, for which the invention is used.

Action of the Invention

As was described above, automatic determination of the pattern position on a workpiece with surface roughness is enabled with high precision by the measure according to the invention by which images of the patterns which are formed only by parts of straight lines with directions which intersect are stored as light-dark signals, by which image signals are integrated in directions which are each parallel to the lines of the above described patterns, by which integration signals are determined which each correspond to the number of the above described lines, and by which the positions of the patterns are determined based on the peak positions by differentiating the respective integral value.

Therefore, it becomes possible to search patterns on different workpieces, such an as an etched wafer, a ceramic substrate, a metal, a thin metallic plate, a printed board and the like without manual assistance; this can contribute to automation of searching of these patterns.

It is to be understood that although a preferred embodiment of the invention has been described, various other embodiments and variations may occur to those skilled in the art. Any such other embodiments and variations which fall within the scope and spirit of the present invention are intended to be covered by the following claims.

What we claim is:

1. Process for pattern searching, in which the position coordinates of patterns formed of straight lines are searched on a workpiece with a surface roughness, comprising the steps of:

storing images of said patterns, which images are formed only by parts of straight lines, as light-dark signals;

determining segment lengths of lines to be integrated based on a contrast of said pattern with respect to a reference level and on said surface roughness of said workpiece;

integrating the light-dark signals along lines which extend in directions which are each parallel to a respective one of the lines of the patterns and which are of the segment lengths determined in said determining step, by which integration signals are determined which correspond to said lines;

producing differential signals which represent a mathematical differentiation of the integration signals and determining actual peak positions of the differential signals; and determining pattern positions on the basis of the peak positions which were determined; wherein the step of determining segment lengths of lines to be integrated is performed in accordance with the relationship:

$$L > |\Delta 2/\Delta 1| d \cdot k$$

where L is the segment length, Δ1 is a contrast difference of the pattern with respect to the reference level and Δ2 is a contrast difference of black cloudiness and milky cloudiness observed as a result of the surface roughness of the workpiece with respect to the reference level, d is a grain size of said black and milky cloudiness, and k is a coefficient corresponding to said surface roughness.

2. Process according to claim 1, wherein the pattern of which an image formed of parts of lines is stored is comprised of lines which intersect orthogonally.

3. Device for positioning of a mask relative to a workpiece comprising:

a mask which is provided with a mask pattern and mask alignment marks formed of a pattern of straight lines;

a mask carrier on which the mask is located;

a workpiece with a surface roughness on which workpiece alignment marks formed of a pattern of straight lines are provided;

a workpiece carrier on which the workpiece is located;

a light irradiation device for irradiating the workpiece with light via said mask;

alignment units for picking up images of the mask alignment marks and the images of alignment marks located on the workpiece; and a control device which receives image signals from the alignment units and has means for determining position coordinates of the alignment marks of the mask and of the workpiece, for driving the mask carrier and the workpiece carrier, and for executing positioning of the mask relative to the workpiece;

wherein the control device has a means for storing the image signals received from alignment units as light-dark signals;

wherein the means for determining comprises means for determining segment lengths of lines to be integrated based on a contrast of said pattern with respect to a reference level and on said surface roughness of the workpiece, means for integrating the light-dark signals stored by the storage means along lines which extend in directions which each are parallel to a respective one the lines of the alignment marks, using data along segments of said lines of the segment lengths determined, to obtain integral values which correspond to each of the lines of the pattern, and means for producing differential signals which represent a mathematical differentiation of the integral values and determining actual peak positions thereof, and means for determining the positions of the alignment marks on the basis of said peak positions; and wherein said means for determining segment lengths of lines to be integrated comprises means for determining the segment lengths in accordance the relationship:

$$L > |\Delta 2/\Delta 1| d \cdot k$$

where L is the segment length, $\Delta 1$ is a contrast difference of the pattern with respect to the reference level and $\Delta 2$ is a contrast difference of black cloudiness and milky cloudiness observed as a result of the surface roughness of the workpiece with respect to the reference level, d is a grain size of said black and milky cloudiness, and k is a coefficient corresponding to said surface roughness.

4. Device according to claim 3, wherein the alignment marks of which the images are formed are comprised of lines which intersect orthogonally.

* * * * *